Aug. 21, 1962 R. A. CONNELL ETAL 3,050,643

SUPERCONDUCTIVE GATE SWITCHING ITS CONDUCTING STATE
IN RESPONSE TO MECHANICAL STRESS IMPOSED
BY PIEZOELECTRIC CRYSTAL

Filed Nov. 3, 1959 2 Sheets-Sheet 1

INVENTORS
RICHARD A. CONNELL
DONALD P. SERAPHIM

BY Frederick S. Smyth
ATTORNEY

United States Patent Office 3,050,643

Patented Aug. 21, 1962

3,050,643

SUPERCONDUCTIVE GATE SWITCHING ITS CONDUCTING STATE IN RESPONSE TO MECHANICAL STRESS IMPOSED BY PIEZOELECTRIC CRYSTAL

Richard A. Connell and Donald P. Seraphim, Poughkeepsie, N.Y., assignors to International Business Machines Corporation, New York, N.Y., a corporation of New York Filed Nov. 3, 1959, Ser. No. 850,700

10 Claims. (Cl. 307—88.5)

This invention relates to superconductive circuits and more particularly to a novel superconductive circuit wherein piezoelectric and ferroelectric materials are employed.

The well known piezoelectric effect has long been employed in electrical circuits particularly in the frequency control of vacuum tube oscillators and as the frequency determining element of band pass filters. Briefly, the piezoelectric effect, as exhibited by certain materials such as quartz, tourmaline and Rochelle salt, can be described as a reversible action wherein an electrical potential applied to the piezoelectric material results in the material exhibiting a dielectric polarization and a resulting mechanical deformation. Conversely a mechanical deformation applied to the material results in an electrical potential appearing across the material. Piezoelectric materials are useful, therefore, to convert electrical energy into mechanical energy, or, alternatively, convert mechanical energy into electrical energy.

Recently a further class of materials has been discovered which exhibits a ferroelectric effect. The ferroelectric effect is somewhat related to the piezoelectric effect in that an electric potential applied to the ferroelectric material also results in a dielectric polarization and resulting mechanical deformation. Piezoelectric materials, however, exhibit a unique polarization axis the direction of which cannot be reversed. The polarization axis of ferroelectric materials can be reversed, provided an opposing electric field of sufficient intensity is applied to the material. The curve indicating the magnitude of the polarization, and thus the mechanical deformation, as a function of the applied potential is similar in shape to the well known square hysteresis loop of ferromagnetic materials and thus ferroelectric materials such as barium titanate have been employed as storage devices and dielectric amplifiers.

When the magnitude of the electrical field applied to a ferroelectric material is not sufficient to reverse the direction of dielectric polarization within the material, these materials are truly piezoelectric; that is, the magnitude of mechanical deformation is linearly related to the magnitude of applied electrical field. The term piezoelectric, as used in the detailed description of the invention to follow, will be understood to include both piezoelectric as well as ferroelectric materials. Further information on both piezoelectric and ferroelectric materials is contained in "Dielectrics and Waves," by A. R. Van Hippel, published in 1954 by John Wiley and Sons, Inc.

The phenomenon of superconductivity, that is, the ability of certain materials to exhibit zero electrical resistance below certain critical temperatures has been employed in various electrical circuits such as flip-flops, amplifiers and logical circuits. In general, these superconductive circuits include one or more cryotron type switching devices. Each cryotron normally includes a gate conductor and an associated control conductor. The gate conductor and control conductor are cooled to a sufficiently low temperature so that each is superconducting. Current flow through the associated control conductor is effective to generate a magnetic field, which, when applied to the gate conductor, destroys superconductivity therein and the gate conductor exhibits a finite value of resistance. Further information on cryotrons and superconductive circuits is contained in an article by D. A. Buck, entitled "The Cryotron—A Superconductive Computer Component," which appeared in the Proceedings of the IRE, vol. 44, No. 4, April 1956, at pages 482 to 493.

What has been discovered is a novel circuit element combining the above summarized effects and phenomenon and improved superconductive circuits employing this element. Basically, this superconductive circuit element comprises a piezoelectric crystal which is provided with first and second electrodes secured to first and second opposite faces thereof, wherein one of the electrodes is a strip of superconductive material. An electrical potential applied between these electrodes is effective to control the state, either superconducting or normal, of the superconductive electrode. In this manner, an electrical voltage, rather than the flow of an electrical current, is effective to control the state of the superconductive electrode.

This control is achieved, according to the present invention, by the deformation of the piezoelectric crystal under the influence of the electrical potential. The resulting deformation of the piezoelectric crystal applies a stress to the superconductive strip electrode and thereby changes its critical temperature, as well as its critical field, depending on the direction of the stress applied to the electrode and the temperature at which the circuit element of the invention is operated. By way of example, when the circuit element is maintained at an operating temperature slightly below the critical temperature of the particular superconductive strip attached to the piezoelectric crystal, an electrical potential of a first polarity impressed across the crystal is effective to deform the superconductive strip and thereby lower its critical temperature. By a proper choice of operating temperature and magnitude of applied electrical potential, the critical temperature of the superconductive electrode is lowered below the operating temperature, and the superconductive strip electrode switches from the resistive to the superconducting state. Further, when the novel circuit element of the invention is maintained at an operating temperature slightly above the critical temperature of the particular superconductive material of the strip attached to the piezoelectric crystal, an electrical potential of a second polarity applied to the crystal is effective to deform the superconductive strip electrode attached thereto and thereby raise its critical temperature. By a proper choice of operating temperature and of the magnitude and polarity of applied electrical potential, the critical temperature of the superconductive strip is raised above the operating temperature and the superconductive electrode switches from the superconducting to the normal resistive state.

The circuit element of the invention may be employed in various novel electrical circuits such as oscillators, pulse generators, flip-flops, etc. as will be understood as the description proceeds. An advantage of the circuit element of the invention lies in the fact that the state of the superconductive conductor is controlled neither by a self-magnetic field nor an applied magnetic field, so that current does not have to build up through an inductance. Rather, the state of the superconductive strip is controlled by means of a mechanical stress. For this reason, the superconductive strip of the circuit element of the invention may be of a convenient size and shape, to thereby obtain a lower current density and a correspondingly higher value of critical current; that is the maximum value of current a superconducting conductor can conduct, without the self current itself destroying superconductivity. A further advantage of the circuit element of the invention is obtained when the element is employed as a voltage control of standard superconductive circuits. In general, superconductive circuits are presently operated in the temperature range near absolute zero and when such materials as tin, lead, tantalum and niobium are employed, the circuits are immersed in liquid helium. In order to apply signal inputs to these superconductive circuits, however, current flow through resistive input leads is required. This current flow generates heat in the form of the usual $I^2R$ power loss in conventional electrical circuits and this heat increases the dissipation of the liquid helium. Voltage control of the input circuits does not generate a corresponding heat loss, however, resulting in a saving in the volume of liquid helium per unit time necessary to maintain the superconductive circuits at a desired operating temperature.

It is an object of the invention, therefore, to provide a novel circuit element useful in superconductive circuits.

Another object of the invention is to provide novel superconductive circuit elements employing piezoelectric materials.

Yet another object of the invention is to provide a superconductive conductor, the resistance of which, either superconducting or normal is voltage controlled.

Still another object of the invention is to provide an improved superconductive oscillator.

A further object of the invention is to provide a voltage controlled superconductive bistable circuit.

Yet another object of the invention is to provide a voltage controlled pulse generator.

The foregoing and other objects, features and advantages of the invention will be apparent from the following more particular description of preferred embodiments of the invention, as is illustrated in the accompanying drawings.

Figure 1:
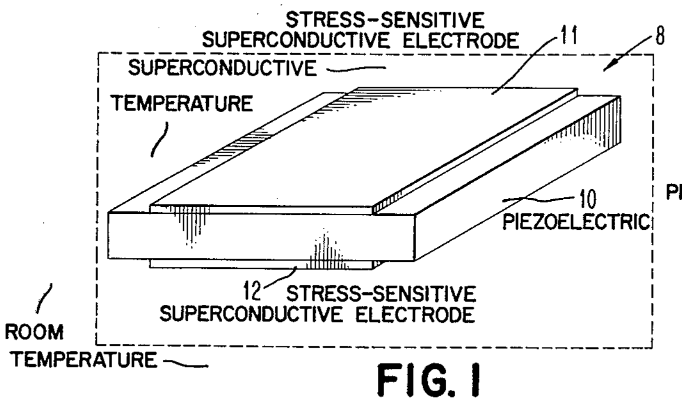
FIG. 1 is a pictorial representation of the circuit element of the invention.
Figure 1A:
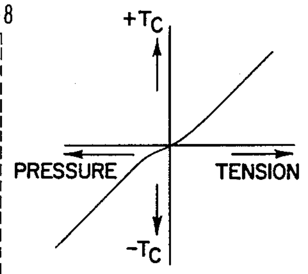
FIG. 1A is a curve representing the variation of critical temperature as a function of applied pressure of the element of FIG. 1.

Referring now to the drawings, FIG. 1 is a pictorial representation of the circuit element of the invention. As shown therein an element 8 includes a body of piezoelectric material 10, having a pair of electrodes 11 and 12 attached to opposite major faces thereof. Electrodes 11 and 12 are each secured to the crystal body 10 by means of thermal evaporation of a metal in a vacuum. In this manner, the metal is volatilized and directed towards the surface of the crystal where it condenses to form a metal film type electrode.

Further, at least one of electrodes 11 and 12 is formed of a superconductive material, that is a material that exhibits zero electrical resistance to the flow of electric current at a sufficiently low or superconductive temperature. In the specific embodiment herein explained, tin is the preferred material for each of electrodes 11 and 12. Unstressed tin has a critical temperature of about 3.73 degrees Kelvin in the absence of an applied magnetic field. It has been shown that pressure lowers the critical temperature of most superconductive materials while tension causes the critical temperature to increase. For tin, it has been determined that the change of critical temperature as a function of the change in pressure is approximately $-5.7\times10^{-5}$ degrees Kelvin/atmosphere.

Piezoelectric crystal bodies are classified in terms which indicate the manner in which the resultant body was orientated with respect to the major axis of the original bulk crystal, such as, by way of example, X-cut, Y-cut, Z-cut, AT(+35° 15′), BT(−49°) etc. Each of these cuts affords certain advantages which are useful in particular applications, such as, by way of example, a low temperature coefficient. Basically, piezoelectric crystals are subjected to one of three types of strain when subjected to an applied electrical potential, flexural, extensional, and shear, depending solely on the particular crystal cut. In the circuit element of the invention, which is operated at a constant temperature, any of the various crystal cuts may be employed. In the description to follow, crystals exhibiting a simple longitudinal strain will be employed, solely as an aid in understanding the operation of the invention. Further information on the various types of crystal cuts and the strains obtainable therefrom is contained in "Quartz Crystals for Electrical Circuits," by R. A. Heising, published by D. Van Nostrand Company, Inc., New York, 1949.

Figure 2A:
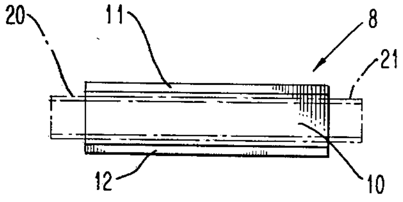
FIG. 2A illustrates the mechanical deformation of the circuit element of the invention in response to a first polarity of applied voltage.
Figure 2B:
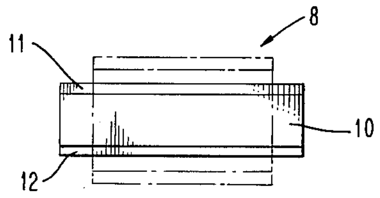
FIG. 2B illustrates the mechanical deformation of the circuit element of the invention in response to a second polarity of applied voltage.

Referring again to the drawings FIG. 2A and FIG. 2B each illustrate the operation of the circuit element of the invention. In the paragraphs to follow, electrode 11 will be referred to as the gate, that is the electrode, the resistance of which, either superconducting or normal, is being controlled. Referring first to FIG. 2A there is shown a side view of circuit element 8. The dotted outline of FIG. 2A indicates the physical deformation of the body 8 when an electrical potential of a first polarity is applied between electrodes 11 and 12. (In FIG. 2A, as well as FIG. 2B, the deformation is enlarged to show details.) In this manner, a tension is applied to the superconductive gate 11 and the length of the gate is increased as shown by regions 20 and 21, to thereby raise its critical temperature. Similarly, FIG. 2B shows a side view of circuit element 8 and the dotted outline indicates the physical deformation of the body 8 when an electrical potential of a second polarity is applied between electrodes 11 and 12. In this manner, a stress is applied to the superconductive gate 11 and the length of this gate is decreased to thereby lower its critical temperature. It thus should be understood, that when the novel circuit element of the invention is operated in the vicinity of its critical temperature, the state of gate 11, superconducting or normal, is controlled by the magnitude and polarity of the voltage applied to the crystal body 10 by electrodes 11 and 12.

Although the circuit element of the invention may be employed in various circuits, only a few such circuits will be discussed as the description proceeds to illustrate the dynamic operation of the element, it then being apparent that the advantages afforded by the element may additionally be obtained in a variety of other circuits. Further, since the method of attaining the required superconductive temperature and accurately controlling this temperature, is well known to those skilled in the art, no discussion of the method will follow, nor will the apparatus be illustrated in the drawings.

Figure 3:
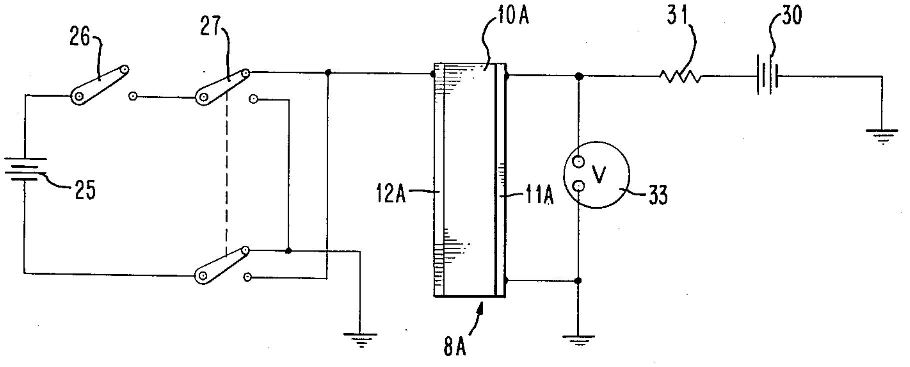
FIG. 3 is a schematic diagram of a circuit employing the element of the invention.

FIG. 3 illustrates a circuit employing the element of the invention. As shown therein, a circuit element of the invention, 8A, includes a piezoelectric crystal body 10A having electrodes 11A and 12A. Electrode 12A is connected to a source of electric potential 25 through a switch 26, and a polarity reversing switch 27. Although switch 26 is schematically represented as a mechanical switch, it should be understood that other types of switches which may be, by way of example, electronic or electromechanical, may be employed. A superconductive gate 11A is connected to a constant current source consisting of a voltage source 30 and a resistor 31. With the polarity reversing switch 27 in the position shown in FIG. 3, the negative terminal of source 25 is effectively connected to electrode 11A, since each are connected to ground, and the positive terminal of source 25 is connected to electrode 12A through switch 26.

Next, with switch 26 open, a voltage indicating device 33, connected in parallel with gate 11A displays zero volts with element 8A operated at a temperature at which gate 11A is superconducting. Closure of switch 26 is effective to apply a potential of sufficient magnitude and polarity to cause the mechanical deformation of crystal body 10A, as shown in FIG. 2B, to occur and cause gate 11A to switch from the superconducting to the normal resistance state. Current from source 30 flowing through gate 11A now develops a voltage, displayed by voltage indicator 33, which is equal to the product of the current from source 30 and the normal resistance of gate 11A. Next, switch 26 is opened, crystal body 10A returns to its original dimensions, gate 11A switches from the normal resistance to the superconducting state and voltage indicating device 33 again displays zero volts.

Alternatively, the circuit of FIG. 3 may be operated in a complementary manner. Switch 27 is transferred to the other position shown in FIG. 3 and the operating temperature is raised so that gate 11A exhibits normal resistance. Alternatively, gate 11A may be caused to exhibit normal resistance without changing the operating temperature by applying a biasing magnetic field thereto, to raise the critical temperature of gate 11A above the operating temperature, since with the magnetic field applied the onset of superconductivity occurs at a lower temperature as described in the above referenced Buck article. Now with switch 26 open, current from source 30 flowing through gate 11A is effective to develop a voltage, displayed by voltage indicator 33, equal to the product of the current and the resistance of the gate. Closure of switch 26 is effective to apply a potential of sufficient magnitude and polarity to cause the mechanical deformation of crystal body 10A, as shown in FIG. 2A, to occur and cause gate 11A to switch from the normal resistance to the superconducting state. Current from source 30 now produces no voltage drop across gate 11A and thus indicator 33 displays zero volts. Next, switch 26 is opened, and crystal 10A returns to its normal dimensions, gate 11A switches from the superconducting to the normal resistance state, and indicating device 33 again displays the voltage developed by the current from source 30 flowing through the resistive gate. It thus may be seen, that circuit element 8A is effective to switch a superconductive gate from the superconducting to the normal resistive state or alternately from the normal resistance to the superconducting state depending on the operating temperature and the polarity of voltage applied thereto.

Figure 4:
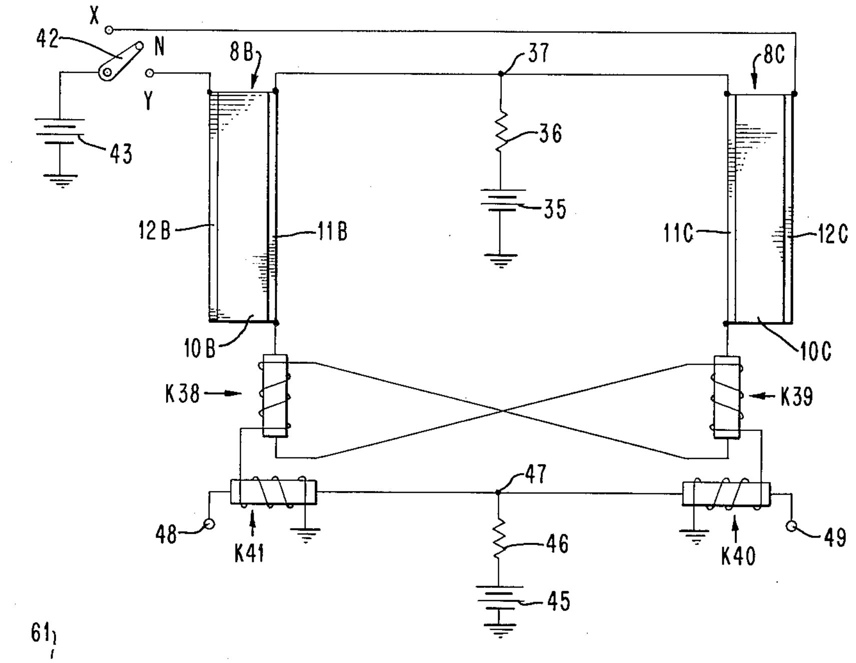
FIG. 4 is a schematic diagram of a bistable circuit employing the element of the invention.

FIG. 4 is a schematic diagram of a bistable superconductive circuit wherein a pair of circuit elements of the invention are employed to determine the state of the circuit, under control of an external voltage source. As shown in FIG. 4, a constant current source consisting of voltage source 35 and resistor 36 delivers a current to a junction 37 and thence to ground through the superconducting one of a pair of parallel paths. The first path includes a superconductive gate 11B of circuit element 8B, the gate conductor of a cryotron K38, the control conductor of a cryotron K39, and the control conductor of a first readout cryotron K40. The second path includes a superconductive gate 11C of circuit element 8C, the gate conductor of cryotron K39, the control conductor of cryotron K38 and the control conductor of a second readout cryotron K41. Current from source 35 has a magnitude sufficient such that flowing through any of the control conductors of cryotrons K38, K39, K40 and K41, the associated gate conductor switches from the superconductive to the normal resistance state. Further, it can be seen that, through the interconnection of the gate and control conductors of cryotrons K38 and K39, current flow in the first or second path introduces resistance into the second or first path, respectively. In this manner one or the other of the parallel paths is normally superconducting, while the remaining path is resistive. Consider now the current from source 35 to be flowing in the second path. A switch 42 is next transferred from N to X and a voltage from a source 43 is applied to electrode 12C and thus across the crystal body 10C of circuit element 8C. This voltage has a magnitude and polarity such that element 8C is mechanically deformed as shown in FIG. 2B and gate 11C secured thereto switches from the superconducting to the normal resistance state, introducing resistance into the second path. At this time both the first and second paths are resistive and a portion of the current flowing in the second path shifts into the first path. This current shift is effective to both increase the resistance in the second path through the portion of the shifted current flowing in the control conductor of K39 and decreasing the resistance in the first path since less current is flowing in the control conductor of K38. This current shift is cumulative until all of the current from source 35 flows through a now superconducting first path. The transfer of switch 42 from X to N returns gate 11C to the superconducting state, and the shifted current remains in the first path. In a similar manner, current is shifted from the first path to the second path when switch 42 is transferred from N to Y. This transfer applies a voltage from source 43 to electrode 12B, and thus across crystal body 10B of circuit element 8B, having a magnitude and polarity such that element 8B is deformed as shown in FIG. 2B and gate 11B secured thereto switches from the superconducting to the normal resistance state. Gate 11B introduces resistance in the first path and a cumulative current shift, as described above, results in the current flowing in a superconducting second path.

Cryotrons K40 and K41 are employed as read out cryotrons to determine the state of the bistable circuit. A current from a constant current source consisting of voltage source 45 and resistance 46 is fed to junction 47 and thence through either the gate conductor K41 to terminal 48 or the gate conductor of K40 to terminal 49 depending on whether the current from source 35 is flowing in the first or second path, respectively.

Figures 5, 6:
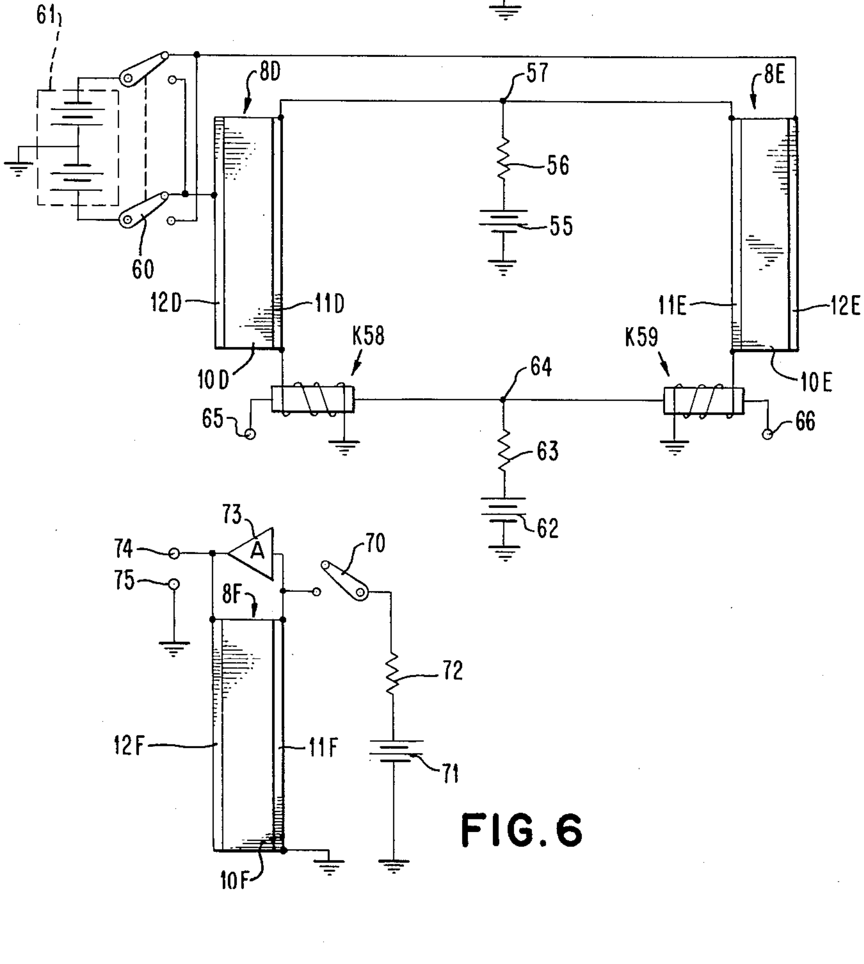
FIG. 5 is a schematic diagram of another bistable circuit employing the element of the invention.
FIG. 6 is a schematic diagram of the circuit element of the invention employed in a superconductive oscillator circuit.

FIG. 5 is a schematic diagram of another superconductive bistable circuit employing a pair of circuit elements of the invention. As there shown a constant current source consisting of voltage source 55 and resistor 56 delivers a current to a junction 57 and thence to ground through one of a pair of parallel paths. The first path includes a superconductive gate 11D of circuit element 8D and the control conductor of a first readout cryotron K58. The second path includes a superconductive gate 11E of circuit element 8E and the control conductor of a second readout cryotron K59. The circuit of FIG. 5 is operated at either a temperature slightly above the critical temperature of gates 11D and 11E or alternatively, at a temperature well above the critical temperature of gates 11D and 11E and biasing magnetic fields are employed to adjust the effective critical temperature of each of the gates to just slightly below the operating temperature. Thus, each of gates 11D and 11E are superconducting in the absence of a potential applied across elements 8D and 8E.

A switch 60 is now effective to apply a voltage of one polarity across a first of the circuit elements and simultaneously a voltage of the opposite polarity across the second of the circuit elements. Specifically, the voltage from a center tapped source 61 is applied through switch 60 in the position shown in FIG. 5 in such manner that electrode 12D is positive with respect to gate 11D of element 8D and electrode 12E is negative with respect to gate 11E of element 8E. Due to the piezoelectric effect of crystal bodies 8D and 8E under these conditions, gate 11D is switched from the superconducting to the normal resistance state. Simultaneously therewith, the critical temperature of gate 11E is raised, and remains superconducting. Thus, current from source 55 flows entirely through the second path and is effective to render the gate conductor of cryotron K59 resistive. Readout current from a source 62 and a resistor 63 flowing to junction 64, thus flows through the superconducting gate of K58 and is available at a terminal 65 to indicate that the current from junction 57 is flowing in the second path.

When switch 60 is transferred to the second position shown in FIG. 5, a second stable state is obtained. Under this condition, the voltage from source 61 is applied in such manner that electrode 12D is negative with respect to gate 11D of element 8D and electrode 12E is positive with respect to gate 11E of element 8E. Again, due to the piezoelectric effect of crystal bodies 8D and 8E, gate 11D is switched from the normal resistance to the superconducting state and simultaneously gate 11E is switched from the superconducting to the normal resistance state. At this time, the first path is superconducting and the second path is resistive and all of the current from source 55 arriving at junction 57 flows through the first path and is effective to render the gate conductor of cryotron K58 resistive. Readout current from source 62 then flows through the superconducting gate conductor of cryotron K59 and is available at a terminal 66 to indicate that the current from source 55 is flowing in the first path.

FIG. 6 is a schematic diagram of the circuit element of the invention employed in a superconductive oscillator. The circuit of FIG. 6 is operated at a temperature slightly lower than the critical temperature of gate 11F of the element 8F, so that gate 11F is normally resistive. The closing of a switch 70 supplies a current to gate 11F from a constant current source consisting of a voltage source 71 in series with resistor 72. This current flowing through the resistive gate 11F develops a voltage which is applied to electrode 12F of element 8F through a D.C. amplifier 73. This voltage, applied to electrode 12F has a magnitude and polarity with respect to gate 11F such that the crystal body deforms and thereby switches gate 11F from the normal resistance to the superconducting state. At this time, there is no voltage developed across gate 11F and, therefore, no voltage applied to electrode 12F, allowing body 10F to return to its original dimensions. However, this return causes gate 11F to also switch to the normal resistance state and again a voltage is applied to electrode 12F by amplifier 73 to switch gate 11F to the superconducting state. This action is repetitive and the voltage pulses produced thereby are available at a pair of terminals 73 and 74.

While the invention has been particularly shown and described with reference to preferred embodiments thereof, it will be understood by those skilled in the art that various changes in form and detail may be made therein without departing from the spirit and scope of the invention.

What is claimed is:

1. A superconductive circuit element comprising; a body of material having piezoelectric properties; a first electrode secured to a first face of said body; a second electrode secured to a second face of said body; at least one of said first and second electrodes being superconducting below a predetermined temperature; and means maintaining said elements at a temperature at which said one electrode is superconducting.

2. A superconductive circuit element comprising; a body of material having piezoelectric properties; first and second electrodes secured to first and second opposite faces of said body; at least one of said electrodes being superconducting below a predetermined temperature; said first and second electrodes effective when an electrical potential is applied therebetween to couple said potential to said body of material to cause a mechanical deformation in said body of material which alters the critical temperature of said superconductive electrode; and means maintaining said element at a superconductive temperature.

3. A superconductive circuit element comprising; a body of material having piezoelectric properties; first and second electrodes secured to first and second opposite faces of said body; at least one of said electrodes fabricated of superconductive material having a predetermined critical temperature; said first and second electrodes effective when an electrical potential of one polarity is applied therebetween to couple said potential of one polarity to said body of material to cause a first mechanical deformation of said body which lowers the critical temperature of said superconductive electrode, and effective when an electrical potential of opposite polarity is applied therebetween to couple said potential of opposite polarity to said body of material to cause a second mechanical deformation of said body which raises the critical temperature of said superconductive electrode; and means maintaining said element at a temperature about equal to said critical temperature.

4. A superconductive circuit element comprising; a body of material; said body of material exhibiting the property that an electrical potential of one polarity applied between opposite faces thereof produces a mechanical deformation in a first direction and an electrical potential of opposite polarity applied between said faces produces a mechanical deformation in a second direction; an electrode applied to each of said faces; at least one of said electrodes exhibiting superconductivity below a predetermined temperature; and means maintaining said element at a temperature at which said one electrode is superconducting.

5. A superconductive bistable circuit comprising; first and second current paths; means connecting said first and second current paths electrically in parallel; a current source; means connecting said source electrically in series with said parallel connected first and second current paths; each of said paths including at least a superconductive gate strip; first and second bodies of piezoelectric material, one for each of said paths; means securing each of said strips to a first face of one of said bodies; first and second electrodes, one for each of said bodies; means securing each of said electrodes to a second face of said bodies; means maintaining said circuit at a temperature at which said gate strips are normally superconducting; each of said electrode and gate strip pair secured to a body effective when a first polarity of voltage is applied therebetween to deform said body in a first direction which destroys superconductivity in said strip and effective when a second polarity of voltage is applied therebetween to deform said body in a second direction which enhances superconductivity in said strip; and means to apply one polarity of voltage between one of said electrode and gate strip pairs and simultaneously apply an opposite polarity of voltage between the other electrode and gate strip pair, whereby only one of said first and second paths is superconducting.

6. A superconductive oscillator comprising; a superconductive circuit element; said element including a body of material having piezoelectric properties, first and second electrodes secured to first and second opposite faces of said body, said first electrode exhibiting superconductivity below a predetermined critical temperature, said first and second electrodes effective when an electrical potential of a first polarity is applied therebetween to cause a mechanical deformation of said body which lowers the critical temperature of said first electrode; means maintaining said circuit element at a temperature lower than said predetermined temperature causing said first electrode to exhibit normal resistance; a current source; means conducting current from said source through said first electrode to develop an electrical potential; and means coupling said developed potential to said first and second electrodes, whereby said coupled potential is effective to mechanically deform said body and render said first electrode superconducting.

7. A superconductive circuit comprising; a body of piezoelectric material; first and second electrodes secured to first and second opposite faces of said body; at least one of said electrodes being of superconductive material; means maintaining said circuit at a temperature slightly below the temperature at which said superconductive electrode exhibits superconductivity; and means selectively operable to destroy superconductivity in said superconductive electrode, said last named means including a source of electrical potential, means connecting said potential across said first and second electrodes to deform said body, said deformation effective to apply tension to said superconductive electrode.

8. A superconductive circuit comprising; a body of piezoelectric material; first and second electrodes secured to first and second opposite faces of said body; at least one of said electrodes being of superconductive material; means maintaining said circuit at a temperature slightly above the temperature at which said electrode exhibits superconductivity; and means selectively operable to render said superconductive electrode superconducting, said last named means including a source of electrical potential, means connecting said potential across said first and second electrodes to deform said body, said deformation effective to apply pressure to said superconductive electrode.

9. A superconductive switching device comprising; a body of material; said body exhibiting the property that an electrical potential of one polarity applied between opposite faces thereof produces a mechanical deformation in a first direction and an electrical potential of opposite polarity applied between said faces produces a mechanical deformation in a second direction; first and second electrodes secured to said opposite faces of said body; at least one of said electrodes being normally superconducting at a superconductive temperature; means maintaining said device at said superconductive temperature; and means coupling potentials of first and second polarities to said first and second electrodes of said device, said potential of first polarity effective to lower the temperature at which said first electrode becomes superconducting and said potential of second polarity effective to raise the temperature at which said first electrode becomes superconducting, whereby said potential of first polarity is further effective to quench superconductivity in said first electrode at said superconductive temperature.

10. A superconductive switching device comprising; a body of material; said body exhibiting the property that an electrical potential of one polarity applied between opposite faces thereof produces a mechanical deformation in a first direction and an electrical potential of opposite polarity applied between said faces produces a mechanical deformation in a second direction; first and second electrodes secured to said opposite faces of said body; at least one of said electrodes being normally superconducting at a superconductive temperature; means maintaining said device at a temperature slightly above said superconductive temperature; and means coupling potentials of first and second polarities to said first and second electrodes of said devices, said potential of first polarity effective to lower the temperature at which said one electrode becomes superconducting and said potential of second polarity effective to raise the temperature at which said one electrode becomes superconducting; whereby said potential of second polarity is further effective to render said one electrode superconducting.

References Cited in the file of this patent

UNITED STATES PATENTS

| | | |
|---|---|---|
| 2,666,884 | Ericsson | Jan. 19, 1954 |
| 2,832,897 | Buck | Apr. 29, 1958 |
| 2,898,477 | Hoesterey | Aug. 4, 1959 |
| 2,931,924 | Simpson | Apr. 5, 1960 |
| 2,944,167 | Matare | July 5, 1960 |

OTHER REFERENCES

Electronic Tube Circuits, by Seely, published by McGraw-Hill, New York, 1950, pp. 256–258.